United States Patent
Takata et al.

(10) Patent No.: US 12,415,953 B2
(45) Date of Patent: Sep. 16, 2025

(54) PHOTODETECTOR ELEMENT AND IMAGE SENSOR

(71) Applicant: FUJIFILM Corporation, Tokyo (JP)

(72) Inventors: Masahiro Takata, Kanagawa (JP);
Masashi Ono, Kanagawa (JP);
Shunsuke Kitajima, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 756 days.

(21) Appl. No.: 17/529,268

(22) Filed: Nov. 18, 2021

(65) Prior Publication Data

US 2022/0077238 A1  Mar. 10, 2022

Related U.S. Application Data

(63) Continuation of application No. PCT/JP2020/020211, filed on May 22, 2020.

(30) Foreign Application Priority Data

Jul. 1, 2019 (JP) .................................. 2019-123103

(51) Int. Cl.
*C09K 11/66* (2006.01)
*C09K 11/02* (2006.01)
(Continued)

(52) U.S. Cl.
CPC .......... *C09K 11/661* (2013.01); *C09K 11/025* (2013.01); *H04N 23/20* (2023.01);
(Continued)

(58) Field of Classification Search
CPC .... C09K 11/661; C09K 11/025; H04N 25/70; H04N 23/20; H04N 30/87; H04N 39/32;
(Continued)

(56) References Cited

U.S. PATENT DOCUMENTS

2009/0110642 A1* 4/2009 Woo .................. A61K 49/0067
424/9.1
2009/0152664 A1* 6/2009 Klem .................. H01L 31/1013
257/466
(Continued)

FOREIGN PATENT DOCUMENTS

JP   2014093327   5/2014
WO   2017054887   4/2017
(Continued)

OTHER PUBLICATIONS

Office Action of Japan Counterpart Application, with English translation thereof, issued on Sep. 6, 2022, pp. 1-5.
(Continued)

*Primary Examiner* — Nathan W Ha
(74) *Attorney, Agent, or Firm* — JCIPRNET

(57) ABSTRACT

A photodetector element has a photoelectric conversion layer containing aggregates of semiconductor quantum dots QD1 that contain a metal atom and containing a ligand L1 that is coordinated to the semiconductor quantum dot QD1, and a hole transport layer containing aggregates of semiconductor quantum dots QD2 that contains a metal atom and containing a ligand L2 that is coordinated to the semiconductor quantum dot QD2, the hole transport layer being arranged on the photoelectric conversion layer, where the ligand L2 includes a ligand represented by any one of Formulae (A) to (C).

$$X^{A1}-L^{A1}-X^{A2} \quad (A)$$

$$X^{B1}-L^{B1}-X^{B3}-L^{B2}-X^{B2} \quad (B)$$

(Continued)

-continued

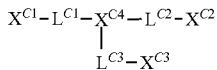

(C)

11 Claims, 1 Drawing Sheet

(51) Int. Cl.
*H04N 23/20* (2023.01)
*H04N 25/70* (2023.01)
*H10K 30/35* (2023.01)
*H10K 30/87* (2023.01)
*H10K 39/32* (2023.01)
*H10K 85/30* (2023.01)
*B82Y 20/00* (2011.01)
*B82Y 40/00* (2011.01)

(52) U.S. Cl.
CPC ............. *H04N 25/70* (2023.01); *H10K 30/35* (2023.02); *H10K 30/87* (2023.02); *H10K 39/32* (2023.02); *H10K 85/30* (2023.02); *B82Y 20/00* (2013.01); *B82Y 40/00* (2013.01)

(58) Field of Classification Search
CPC .......... H04N 50/35; H04N 5/33; H10K 30/35; H10K 39/32; H10K 85/30; H01L 31/0264; H01L 31/10; Y02E 10/549; B82Y 20/00; B82Y 40/00
See application file for complete search history.

(56) References Cited

U.S. PATENT DOCUMENTS

| | | | |
|---|---|---|---|
| 2015/0021528 A1* | 1/2015 | Chartoff | C08K 9/04 556/136 |
| 2015/0344652 A1* | 12/2015 | Linxian | C08J 7/18 525/275 |
| 2016/0248032 A1* | 8/2016 | Seo | H10K 50/13 |
| 2018/0254421 A1* | 9/2018 | Kinge | H10K 30/35 |
| 2019/0276733 A1* | 9/2019 | Mei | B01J 19/0013 |

FOREIGN PATENT DOCUMENTS

| | | | | |
|---|---|---|---|---|
| WO | WO-2017054887 A1 * | 4/2017 | | H01L 51/005 |
| WO | 2017191356 | 11/2017 | | |

OTHER PUBLICATIONS

Chia-Hao M. Chuang et al., "Improved performance and stability in quantum dot solar cells through band alignment engineering," Nature Materials, vol. 13, May 2014, pp. 796-801.

Santanu Pradhan et al., "Trap-State Suppression and Improved Charge Transport in PbS Quantum Dot Solar Cells with Synergistic Mixed-Ligand Treatments," Small, Apr. 2017, pp. 1-9.

"International Search Report (Form PCT/ISA/210) of PCT/JP2020/020211," mailed on Aug. 11, 2020, with English translation thereof, pp. 1-6.

"Written Opinion of the International Searching Authority (Form PCT/ISA/237)" of PCT/JP2020/020211, mailed on Aug. 11, 2020, with English translation thereof, pp. 1-6.

"Decision of Dismissal of Amendment of Japan Counterpart Application", issued on Sep. 5, 2023, with English translation thereof, p. 1-p. 9.

"Office Action of Japan Counterpart Application", issued on Mar. 7, 2023, with English translation thereof, p. 1-p. 6.

* cited by examiner

PHOTODETECTOR ELEMENT AND IMAGE SENSOR

CROSS-REFERENCE TO RELATED APPLICATIONS

This application is a Continuation of PCT International Application No. PCT/JP2020/020211 filed on May 22, 2020, which claims priority under 35 U.S.C § 119 (a) to Japanese Patent Application No. 2019-123103 filed on Jul. 1, 2019. Each of the above application(s) is hereby expressly incorporated by reference, in its entirety, into the present application.

BACKGROUND OF THE INVENTION

1. Field of the Invention

The present invention relates to a photodetector element having a photoelectric conversion layer that contains semiconductor quantum dots and an image sensor.

2. Description of the Related Art

In recent years, attention has been focused on photodetector elements capable of detecting light in the infrared region in the fields such as smartphones, surveillance cameras, and in-vehicle cameras.

In the related art, a silicon photodiode in which a silicon wafer is used as a material of a photoelectric conversion layer has been used in a photodetector element that is used in an image sensor or the like. However, a silicon photodiode has low sensitivity in the infrared region having a wavelength of 900 nm or more.

In addition, an InGaAs-based semiconductor material known as a near-infrared light-receiving element has a problem in that it requires extremely high-cost processes such as epitaxial growth for achieving high quantum efficiency, and thus it has not been widespread.

By the way, in recent years, research on semiconductor quantum dots has been advanced. For example, an element for a solar cell, in which a ZnO film, a semiconductor film containing PbS quantum dots treated with tetrabutylammonium iodide, a semiconductor film containing PbS quantum dots treated with ethanedithiol, and an Au electrode are laminated on an indium tin oxide electrode, is disclosed in Chia-Hao M. Chuang, Patrick R. Brown, Vladimir Bulovic and Moungi G. Bawendi 4, "Improved performance and stability in quantum dot solar cells through band alignment engineering", Nature Materials, 13 (2014), 796-801. In addition, an element for a solar cell, in which a ZnO film, a semiconductor film containing PbS quantum dots treated with $ZnI_2$ and 3-mercaptopropionic acid, a semiconductor film containing PbS quantum dots treated with ethanedithiol, and an Au electrode are laminated on an indium tin oxide electrode, is disclosed in Santanu Pradhan, Alexandros Stavrinadis, Shuchi Gupta, Yu Bi, Francesco Di Stasio and Gerasimos Konstantatos, "Trap-State Suppression and Improved Charge Transport in PbS Quantum Dot Solar Cells with Synergistic Mixed-Ligand Treatments", Small, 13 (2017), 1700598.

SUMMARY OF THE INVENTION

In recent years, with the demand for performance improvement of an image sensor the like, further improvement of various characteristics that is required in a photodetector element used in the image sensor the like is also required. For example, the in-plane variation of the external quantum efficiency of a photodetector element is required to be small.

As a result of studying the elements disclosed in Chia-Hao M. Chuang, Patrick R. Brown, Vladimir Bulovic and Moungi G. Bawendi 4, "Improved performance and stability in quantum dot solar cells through band alignment engineering", Nature Materials, 13 (2014), 796-801, and Santanu Pradhan, Alexandros Stavrinadis, Shuchi Gupta, Yu Bi, Francesco Di Stasio and Gerasimos Konstantatos, "Trap-State Suppression and Improved Charge Transport in PbS Quantum Dot Solar Cells with Synergistic Mixed-Ligand Treatments", Small, 13 (2017), 1700598, the inventors of the present invention found that in these elements, the in-plane variation of external quantum efficiency is large, and in a case where these elements are applied to a photodetector element, noise is easily generated.

An object of the present invention is to provide a photodetector element and an image sensor, which are excellent in the in-plane uniformity of external quantum efficiency.

According to the study of the inventors of the present invention, it has been found that the above problems can be solved by adopting the following configurations, and the present invention has been completed. The present invention provides the following.

<1> A photodetector element comprising:
a photoelectric conversion layer containing aggregates of semiconductor quantum dots QD1 that contain a metal atom and containing a ligand L1 that is coordinated to the semiconductor quantum dot QD1; and
a hole transport layer containing aggregates of semiconductor quantum dots QD2 that contains a metal atom and containing a ligand L2 that is coordinated to the semiconductor quantum dot QD2, the hole transport layer being arranged on the photoelectric conversion layer,
in which the ligand L2 includes a ligand represented by any one of Formulae (A) to (C),

in Formula (A), $X^{A1}$ and $X^{A2}$ each independently represent a thiol group, an amino group, a hydroxy group, a carboxy group, a sulfo group, a phospho group, or a phosphonic acid group, and
$L^{A1}$ represents a hydrocarbon group, where $X^{A1}$ is a group different from $X^{A2}$,
in Formula (B), $X^{B1}$ and $X^{B2}$ each independently represent a thiol group, an amino group, a hydroxy group, a carboxy group, a sulfo group, a phospho group, or a phosphonic acid group,
$X^{B3}$ represents S, O, or NH, and
$L^{B1}$ and $L^{B2}$ each independently represent a hydrocarbon group,
in Formula (C), $X^{C1}$ to $X^{C3}$ each independently represent a thiol group, an amino group, a hydroxy group, a carboxy group, a sulfo group, a phospho group, or a phosphonic acid group, $X^{C4}$ represents N, and $L^{C1}$ to $L^{C3}$ each independently represent a hydrocarbon group.

<2> The photodetector element according to <1>, in which one of $X^{A1}$ or $X^{A2}$ in Formula (A) is a thiol group, at least one of $X^{B1}$ or $X^{B2}$ in Formula (B) is a thiol group, and at least one of $X^{C1}$ to $X^{C3}$ in Formula (C) is a thiol group.

<3> The photodetector element according to <1> or <2>, in which the ligand L2 is at least one selected from thioglycolic acid, 3-mercaptopropionic acid, 2-aminoethanethiol, or 2-mercaptoethanol.

<4> The photodetector element according to any one of <1> to <3>, in which the ligand L1 includes a ligand different from the ligand L2.

<5> The photodetector element according to any one of <1> to <4>, in which the ligand L1 contains a ligand containing a halogen atom and a polydentate ligand containing two or more coordination moieties.

<6> The photodetector element according to <5>, in which the ligand containing a halogen atom is an inorganic halide.

<7> The photodetector element according to <6>, in which the inorganic halide contains a Zn atom.

<8> The photodetector element according to any one of <5> to <7>, in which the ligand containing a halogen atom contains an iodine atom.

<9> The photodetector element according to any one of <1> to <8>, in which the semiconductor quantum dot QD1 and the semiconductor quantum dot QD2 each contain a Pb atom.

<10> The photodetector element according to any one of <1> to <8>, in which the semiconductor quantum dot QD1 and the semiconductor quantum dot QD2 each contain the same kind of semiconductor quantum dot.

<11> The photodetector element according to any one of <1> to <8>, in which the semiconductor quantum dot QD1 and the semiconductor quantum dot QD2 each contain PbS.

<12> The photodetector element according to any one of <1> to <11>, in which an energy difference $\Delta^{E1}$ between a Fermi level of the photoelectric conversion layer and a conductor lower end and an energy difference $\Delta^{E2}$ between a Fermi level of the hole transport layer and the conductor lower end satisfy a relationship of Expression (1), $$(\Delta^{E2}-\Delta^{E1}) \geq 0.1 [eV] \quad (1)$$

<13> The photodetector element according to any one of <1> to <12>, in which the photodetector element is a photodiode-type photodetector element.

<14> An image sensor comprising the photodetector element according to any one of <1> to <13>.

<15> The image sensor according to <14>, in which the image sensor is an infrared image sensor.

According to the present invention, it is possible to provide a photodetector element and an image sensor, which are excellent in the in-plane uniformity of external quantum efficiency.

DESCRIPTION OF THE PREFERRED EMBODIMENTS

Figure 1:
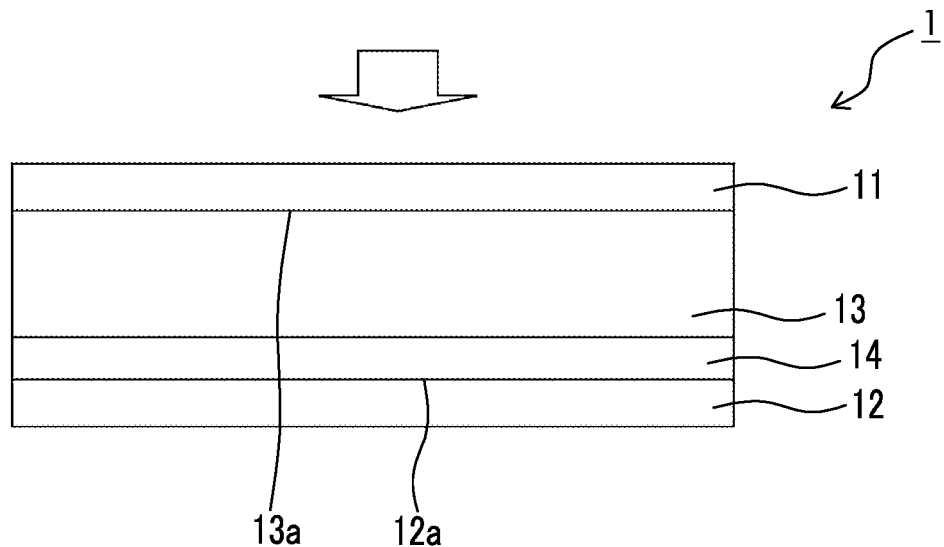
FIG. 1 is a diagram illustrating an embodiment of a photodetector element.

Hereinafter, the contents of the present invention will be described in detail.

In the present specification, "to" is used to mean that numerical values described before and after "to" are included as a lower limit value and an upper limit value, respectively.

In describing a group (an atomic group) in the present specification, in a case where a description about substitution and non-substitution is not provided, the description means the group includes a group (an atomic group) having a substituent as well as a group (an atomic group) having no substituent. For example, the "alkyl group" includes not only an alkyl group that does not have a substituent (an unsubstituted alkyl group) but also an alkyl group that has a substituent (a substituted alkyl group).

<Photodetector Element>

The photodetector element according to the embodiment of the present invention is characterized the following:

the photodetector element includes a photoelectric conversion layer containing aggregates of semiconductor quantum dots QD1 that contains a metal atom and containing a ligand L1 coordinated to the semiconductor quantum dot QD1; and a hole transport layer containing aggregates of semiconductor quantum dots QD2 that contains a metal atom and containing a ligand L2 that is coordinated to the semiconductor quantum dot QD2, the hole transport layer being arranged on the photoelectric conversion layer, in which the ligand L2 includes a ligand represented by any one of Formulae (A) to (C).

The photodetector element according to the embodiment of the present invention is excellent in the in-plane uniformity of external quantum efficiency. The detailed reason why such effects are obtained is unknown; however, it is presumed to be due to the following.

In the photodetector element according to the embodiment of the present invention, both the photoelectric conversion layer and the hole transport layer contain aggregates of semiconductor quantum dots, and the hole transport layer contains a predetermined ligand represented by any one of Formulae (A) to (C) as a ligand that is coordinated to a semiconductor quantum dot QD2.

In the ligand represented by Formula (A) (hereinafter, also referred to as the ligand (A)), it is presumed that the portions of $X^{A1}$ and $X^{A2}$ are coordinated to the metal atom of the semiconductor quantum dot. In the ligand (A), $X^{A1}$ and $X^{A2}$ are different groups, and thus it is conceived that one group of $X^{A1}$ and $X^{A2}$, having a strong coordinating power with respect to the metal atom, is first coordinated to the metal atom of the semiconductor quantum dot, and the other group having weak coordinating power is coordinated to the metal atom due to the adjacent position effect. For this reason, it is presumed that the ligand (A) is subjected to chelate coordination to the metal atom of the semiconductor quantum dot.

In the ligand represented by Formula (B) (hereinafter, also referred to as the ligand (B)), it is presumed that the portions of $X^{B1}$ to $X^{B3}$ are coordinated to the metal atom of the semiconductor quantum dot. In addition, in the ligand represented by Formula (C) (hereinafter, also referred to as the ligand (C)), it is presumed that the portions of $X^{C1}$ to $X^{C4}$ are coordinated to the metal atom of the semiconductor quantum dot. The ligand (B) and the ligand (C) have three or more portions, in one molecule, which are coordinated to the metal atom of the semiconductor quantum dot, and thus it is presumed that they are easily subjected to chelate coordination to the metal atom of the semiconductor quantum dot and that they have a high bonding force with the metal atom.

For this reason, it is presumed that the ligand L2 is firmly coordinated on the surface of the semiconductor quantum dot QD2, the ligand L2 is difficult to be peeled off from the surface of the semiconductor quantum dot QD2, and thus the surface defects of the semiconductor quantum dot QD2 are reduced.

In addition, as described above, the ligands (A) to (C) are easily subjected to chelate coordination to the semiconductor quantum dot QD2 and are hardly cross-linked, and thus it is presumed that cracking in film or film peeling can be suppressed.

For the above reasons, it is presumed that the photodetector element according to the embodiment of the present invention is excellent in the in-plane uniformity of external quantum efficiency.

In addition, in a case where such a hole transport layer is laminated on a photoelectric conversion layer containing aggregates of semiconductor quantum dots QD1 that contain a metal atom and containing a ligand L1 that is coordinated to the semiconductor quantum dot QD1, it is possible to suppress the occurrence of defects at the interface between the two layers, and as a result, it is possible to increase the external quantum efficiency.

As a result, the photodetector element according to the embodiment of the present invention can be made to have a high external quantum efficiency and excellent in-plane uniformity.

In addition, in the hole transport layer, the ligand L2 is subjected to chelate coordination to the metal atom of the semiconductor quantum dot to suppress the steric hindrance between the semiconductor quantum dots, which brings the semiconductor quantum dots to be closer with each other, and thus high electrical conductivity is easily obtained, and a high external quantum efficiency is obtained. As a result, the photodetector element according to the embodiment of the present invention can be made to have a high external quantum efficiency and excellent in-plane uniformity of the external quantum efficiency.

In the photodetector element according to the embodiment of the present invention, an energy difference $\Delta^{E1}$ between a Fermi level of the photoelectric conversion layer and a conductor lower end and an energy difference $\Delta^{E2}$ between a Fermi level of the hole transport layer and the conductor lower end preferably satisfy a relationship of Expression (1). In a case where the relationship of Formula (1) is satisfied, a high external quantum efficiency is easily obtained. It is presumed that as the value of $(\Delta^{E2}-\Delta^{E1})$ increases, the internal potential at the junction interface increases, and thus carrier separation easily occurs, that is, the number of carriers deactivated by re-bonding decreases.

$$(\Delta E2-\Delta E1) \geq 0.1 [eV] \quad (1)$$

In Expression (1), the value of $(\Delta^{E2}-\Delta^{E1})$ is preferably 0.2 [eV] or more and more preferably 0.4 [eV] or more. In addition, the value of $(\Delta^{E2}-\Delta^{E1})$ is more preferably 1.0 [eV] or less from the viewpoint of suppressing dark current.

Hereinafter, the details of the photodetector element according to the embodiment of the present invention will be described.

(Photoelectric Conversion Layer)

The photoelectric conversion layer of the photodetector element according to the embodiment of the present invention has aggregates of the semiconductor quantum dots QD1 containing a metal atom. The aggregate of semiconductor quantum dots means a form in which a large number of semiconductor quantum dots (for example, 100 or more quantum dots per 1 μm$^2$) are arranged close to each other. In addition, the "semiconductor" in the present invention means a substance having a specific resistance value of $10^{-2}$ Ω·cm or more and $10^8$ Ω·cm or less.

The semiconductor quantum dot QD1 is a semiconductor particle having a metal atom. It is noted that in the present invention, the metal atom also includes a metalloid atom represented by a Si atom. Examples of the semiconductor quantum dot material that constitutes the semiconductor quantum dot QD1 include a nano particle (a particle having a size of 0.5 nm or more and less than 100 nm) of a general semiconductor crystal [a) a Group IV semiconductor, b) a compound semiconductor of a Group IV to IV element, a Group III to V element, or a Group II to VI element, or c) a compound semiconductor consisting of a combination of three or more of a Group II element, a Group III element, a Group IV element, a Group V element, and a Group VI element].

The semiconductor quantum dot QD1 preferably contains at least one metal atom selected from a Pb atom, an In atom, a Ge atom, a Si atom, a Cd atom, a Zn atom, a Hg atom, an Al atom, a Sn atom, or a Ga atom, more preferably at least one metal atom selected from a Pb atom, an In atom, a Ge atom, or a Si atom, and due to the reason that the effects of the present invention are easily obtained more remarkably, it still more contains a Pb atom.

Specific examples of the semiconductor quantum dot material that constitutes the semiconductor quantum dot QD1 include semiconductor materials having a relatively narrow band gap, such as PbS, PbSe, InN, InAs, Ge, InAs, InGaAs, CuInS, CuInSe, CuInGaSe, InSb, HgTe, HgCdTe, $Ag_2S$, $Ag_2Se$, $Ag_2Te$, SnS, SnSe, SnTe, Si, and InP. Among them, the semiconductor quantum dot QD1 preferably contains PbS or PbSe, and more preferably contains PbS, due to the reason that it is easy to efficiently convert light in the infrared region (preferably, light having a wavelength of 700 to 2,500 nm) to electrons.

The semiconductor quantum dot QD1 may be a material having a core-shell structure in which a semiconductor quantum dot material is made to the nucleus (the core) and the semiconductor quantum dot material is covered with a coating compound. Examples of the coating compound include ZnS, ZnSe, ZnTe, ZnCdS, CdS, and GaP.

The band gap of the semiconductor quantum dot QD1 is preferably 0.5 to 2.0 eV. In a case where the band gap of the semiconductor quantum dot is within the above range, it is possible to obtain a photodetector element capable of detecting light of various wavelengths depending on the use application. For example, it is possible to obtain a photodetector element capable of detecting light in the infrared region. The upper limit of the band gap of the semiconductor quantum dot QD1 is preferably 1.9 eV or less, more preferably 1.8 eV or less, and still more preferably 1.5 eV or less. The lower limit of the band gap of the semiconductor quantum dot QD1 is preferably 0.6 eV or more and more preferably 0.7 eV or more.

The average particle diameter of the semiconductor quantum dots QD1 is preferably 2 nm to 15 nm. The average particle diameter of the semiconductor quantum dots QD1 refers to the average particle diameter of ten semiconductor quantum dots. A transmission electron microscope may be used for measuring the particle diameter of the semiconductor quantum dots.

Generally, a semiconductor quantum dot contains particles of various sizes from several nm to several tens of nm. In the semiconductor quantum dot, in a case where the average particle diameter of semiconductor quantum dots are reduced to a size equal to or smaller than the Bohr radius of the internal electrons, a phenomenon in which the band gap of the semiconductor quantum dot changes due to the quantum size effect occurs. In a case where the average particle diameter of semiconductor quantum dots are 15 nm or less, it is easy to control the band gap by the quantum size effect.

The photoelectric conversion layer of the photodetector element according to the embodiment of the present invention contains a ligand L1 that is coordinated to the semiconductor quantum dot QD1. Examples of the ligand include a ligand containing a halogen atom and a polydentate ligand containing two or more coordination moieties. The photoelectric conversion layer may contain only one kind of ligand or may contain two or more kinds of ligands. The ligand L1 preferably includes a ligand different from the ligand L2 of the hole transport layer. Among the above, the photoelectric conversion layer preferably contains a ligand containing a halogen atom and a polydentate ligand. According to this aspect, it is possible to further improve an electrical conductivity, a photocurrent value, an external quantum efficiency, an in-plane uniformity of external quantum efficiency, and the like. It is presumed that the reason why such effects are obtained is as follows. It is presumed that the polydentate ligand is subjected to chelate coordination to the semiconductor quantum dot QD1, and thus it is presumed that the peeling of the ligand from the semiconductor quantum dot QD1 can be suppressed more effectively. In addition, it is presumed that steric hindrance between semiconductor quantum dots QD1 can be suppressed by chelate coordination. For this reason, it is conceived that the steric hindrance between the semiconductor quantum dots QD1 is reduced, and thus the semiconductor quantum dots QD1 are closely arranged to strengthen the overlap of the wave functions between the semiconductor quantum dots QD1. Furthermore, in a case where a ligand containing a halogen atom is further contained as the ligand L1 that is coordinated to the semiconductor quantum dot QD1, it is presumed that the ligand containing a halogen atom is coordinated in the gap where the polydentate ligand is not coordinated, and thus it is presumed that the surface defects of the semiconductor quantum dot QD1 can be reduced. As a result, it is presumed that it is possible to further improve an electrical conductivity, a photocurrent value, an external quantum efficiency, an in-plane uniformity of external quantum efficiency, and the like.

First, the ligand containing a halogen atom will be described. Examples of the halogen atom contained in the ligand containing a halogen atom include a fluorine atom, a chlorine atom, a bromine atom, and an iodine atom, and an iodine atom is preferable from the viewpoint of coordinating power.

The ligand containing a halogen atom may be an organic halide or may be an inorganic halide. Among the above, an inorganic halide is preferable due to the reason that it is easily coordinated to both the cation site and the anion site of the semiconductor quantum dot QD1. In addition, the inorganic halide is preferably a compound containing a metal atom selected from a Zn atom, an In atom, and a Cd atom, and it is more preferably a compound containing a Zn atom. The inorganic halide is more preferably a salt of a metal atom and a halogen atom due to the reason that the salt is ionized and easily coordinated to the semiconductor quantum dot QD1.

Specific examples of the ligand containing a halogen atom include zinc iodide, zinc bromide, zinc chloride, indium iodide, indium bromide, indium chloride, cadmium iodide, cadmium bromide, and cadmium chloride, gallium iodide, gallium bromide, gallium chloride, and tetrabutylammonium iodide, and zinc iodide is particularly preferable.

In the ligand containing a halogen atom, the halogen ion may be dissociated from the ligand containing a halogen atom, and the halogen ion may be coordinated on the surface of the semiconductor quantum dot QD1. In addition, a portion of the ligand containing a halogen atom, other than the halogen, may also be coordinated on the surface of the semiconductor quantum dot QD1. To describe with a specific example, in the case of zinc iodide, zinc iodide may be coordinated on the surface of the semiconductor quantum dot QD1, or the iodine ion or the zinc ion may be coordinated on the surface of the semiconductor quantum dot QD1.

Next, the polydentate ligand will be described. Examples of the coordination moiety contained in the polydentate ligand include a thiol group, an amino group, a hydroxy group, a carboxy group, a sulfo group, a phospho group, and a phosphonic acid group. The polydentate ligand is preferably a compound containing a thiol group due to the reason that the compound is easily coordinated firmly on the surface of the semiconductor quantum dot QD1.

Examples of the polydentate ligand include a ligand represented by any one of Formulae (D) to (F).

$$X^{D1} - L^{D1} - X^{D2} \quad (D)$$

$$X^{E1} - L^{E1} - X^{E3} - L^{E2} - X^{E2} \quad (E)$$

$$X^{F1} - L^{F1} - X^{F4} - L^{F2} - X^{F2} \\ \quad\quad\quad\;\; | \\ \quad\quad\quad\; L^{F3} - X^{F3} \quad (F)$$

In Formula (D), $X^{D1}$ and $X^{D2}$ each independently represent a thiol group, an amino group, a hydroxy group, a carboxy group, a sulfo group, a phospho group, or a phosphonic acid group, and $L^{D1}$ represents a hydrocarbon group.

In Formula (E), $X^{E1}$ and $X^{E2}$ each independently represent a thiol group, an amino group, a hydroxy group, a carboxy group, a sulfo group, a phospho group, or a phosphonic acid group, $X^{E3}$ represents S, O, or NH, and $L^{E1}$ and $L^{E2}$ each independently represent a hydrocarbon group.

In Formula (F), $X^{F1}$ to $X^{F3}$ each independently represent a thiol group, an amino group, a hydroxy group, a carboxy group, a sulfo group, a phospho group, or a phosphonic acid group, $X^{F4}$ represents N, and $L^{F1}$ to $L^{F3}$ each independently represent a hydrocarbon group.

The amino group represented by $X^{D1}$, $X^{D2}$, $X^{E1}$, $X^{E2}$, $X^{F1}$, $X^{F2}$, or $X^{F3}$ is not limited to —$NH_2$ and includes a substituted amino group and a cyclic amino group as well. Examples of the substituted amino group include a monoalkylamino group, a dialkylamino group, a monoarylamino group, a diarylamino group, and an alkylarylamino group. The amino group represented by these groups is preferably —$NH_2$, a monoalkylamino group, or a dialkylamino group, and —$NH_2$ is more preferable.

The hydrocarbon group represented by $L^{D1}$, $L^{E1}$, $L^{E2}$, $L^{F1}$, $L^{F2}$, or $L^{F3}$ is preferably an aliphatic hydrocarbon group. The aliphatic hydrocarbon group may be a saturated aliphatic hydrocarbon group or may be an unsaturated aliphatic hydrocarbon group. The hydrocarbon group preferably has 1 to 20 carbon atoms. The upper limit of the number of carbon atoms is preferably 10 or less, more preferably 6 or less, and still more preferably 3 or less. Specific examples of the hydrocarbon group include an alkylene group, an alkenylene group, and an alkynylene group.

Examples of the alkylene group include a linear alkylene group, a branched alkylene group, and a cyclic alkylene group. A linear alkylene group or a branched alkylene group is preferable, and a linear alkylene group is more preferable. Examples of the alkenylene group include a linear alkenylene group, a branched alkenylene group, and a cyclic alkenylene group. A linear alkenylene group or a branched alkenylene group is preferable, and a linear alkenylene group is more preferable. Examples of the alkynylene group include a linear alkynylene group and a branched alkynylene group, and a linear alkynylene group is preferable. The alkylene group, the alkenylene group, and the alkynylene group may further have a substituent. The substituent is preferably a group having 1 or more and 10 or less atoms. Preferred specific examples of the group having 1 to 10 atoms include an alkyl group having 1 to 3 carbon atoms [a methyl group, an ethyl group, a propyl group, or an isopropyl group], an alkenyl group having 2 or 3 carbon atoms [an ethenyl group or a propenyl group], an alkynyl group having 2 to 4 carbon atoms [an ethynyl group, a propynyl group, or the like], a cyclopropyl group, an alkoxy group having 1 or 2 carbon atoms [a methoxy group or an ethoxy group], an acyl group having 2 or 3 carbon atoms [an acetyl group or a propionyl group], an alkoxycarbonyl group having 2 or 3 carbon atoms [a methoxycarbonyl group or an ethoxycarbonyl group], an acyloxy group having 2 carbon atoms [an acetyloxy group], an acylamino group having 2 carbon atoms [an acetylamino group], a hydroxyalkyl group having 1 to 3 carbon atoms [a hydroxymethyl group, a hydroxyethyl group, or a hydroxypropyl group], an aldehyde group, a hydroxy group, a carboxy group, a sulfo group, a phospho group, a carbamoyl group, a cyano group, an isocyanate group, a thiol group, a nitro group, a nitroxy group, an isothiocyanate group, a cyanate group, a thiocyanate group, an acetoxy group, an acetamide group, a formyl group, a formyloxy group, a formamide group, a sulfamino group, a sulfino group, a sulfamoyl group, a phosphono group, an acetyl group, a halogen atom, and an alkali metal atom.

In Formula (D), $X^{D1}$ and $X^{D2}$ are separated by $L^{D1}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

In Formula (E), $X^{E1}$ and $X^{E3}$ are separated by $L^{E1}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms. In addition, $X^{E2}$ and $X^{E3}$ are separated by $L^{E2}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

In Formula (F), $X^{F1}$ and $X^{F4}$ are separated by $L^{F1}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms. In addition, $X^{F2}$ and $X^{F4}$ are separated by $L^{F2}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms. In addition, $X^{F3}$ and $X^{F4}$ are separated by $L^{F3}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

It is noted that the description that $X^{D1}$ and $X^{D2}$ are separated by $L^{D1}$ by 1 to 10 atoms means that the number of atoms that constitute the shortest molecular chain connecting $X^{D1}$ and $X^{D2}$ is 1 to 10 atoms. For example, in a case of Formula (D1), $X^{D1}$ and $X^{D2}$ are separated by two atoms, and in cases of Formulae (D2) and (D3), $X^{D1}$ and $X^{D2}$ are separated by 3 atoms. The numbers added to the following structural formulae represent the arrangement order of atoms constituting the shortest distance molecular chain connecting $X^{D1}$ and $X^{D2}$.

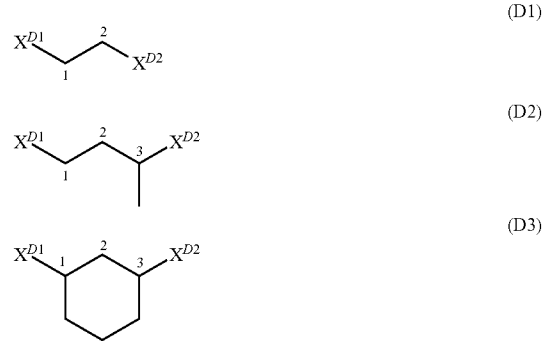

To describe with a specific compound, 3-mercaptopropionic acid is a compound (a compound having the following structure) having a structure in which a portion corresponding to $X^{D1}$ is a carboxy group, a portion corresponding to $X^{D2}$ is a thiol group, and a portion corresponding to $L^{D1}$ is an ethylene group. In 3-mercaptopropionic acid, $X^{D1}$ (the carboxy group) and $X^{D2}$ (the thiol group) are separated by $L^{D1}$ (the ethylene group) by two atoms.

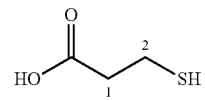

The same applies to the meanings that $X^{E1}$ and $X^{E3}$ are separated by $L^{E1}$ by 1 to 10 atoms, $X^{E2}$ and $X^{F3}$ are separated by $L^{E2}$ by 1 to 10 atoms, $X^{F1}$ and $X^{F4}$ are separated by $L^{F1}$ by 1 to 10 atoms, $X^{F2}$ and $X^{F4}$ are separated by $L^{F2}$ by 1 to 10 atoms, and $X^{F3}$ and $X^{F4}$ are separated by $L^{F3}$ by 1 to 10 atoms.

Specific examples of the polydentate ligand include 3-mercaptopropionic acid, thioglycolic acid, 2-aminoethanol, 2-aminoethanethiol, 2-mercaptoethanol, glycolic acid, diethylenetriamine, tris(2-aminoethyl)amine, 4-mercaptobutanoic acid, 3-aminopropanol, 3-mercaptopropanol, N-(3-aminopropyl)-1,3-propanediamine, 3-(bis(3-aminopropyl)amino)propane-1-ol,1-thioglycerol, dimercaprol, 1-mercapto-2-butanol, 1-mercapto-2-pentanol, 3-mercapto-1-propanol, 2,3-dimercapto-1-propanol, diethanolamine, 2-(2-aminoethyl)aminoethanol, dimethylenetriamine, 1,1-oxybismethylamine, 1,1-thiobismethylamine, 2-[(2-aminoethyl)amino]ethanethiol, bis(2-mercaptoethyl)amine, 2-aminoethane-1-thiol, 1-amino-2-butanol, 1-amino-2-pentanol, L-cysteine, D-cysteine, 3-amino-1-propanol, L-homoserine, D-homoserine, aminohydroxyacetic acid, L-lactic acid, D-lactic acid, L-malic acid, D-malic acid, glyceric acid, 2-hydroxybutyric acid, L-tartaric acid, D-tartaric acid, tartronic acid, and derivatives thereof.

The complex stability constant K1 of the polydentate ligand with respect to the metal atom contained in the semiconductor quantum dot QD1 is preferably 6 or more, more preferably 8 or more, and still more preferably 9 or more. In a case where the complex stability constant K1 is 6 or more, the strength of the bond between the semiconductor quantum dot QD1 and the polydentate ligand can be increased. For this reason, it is possible to suppress the peeling of the polydentate ligand from the semiconductor quantum dot QD1, and as a result, it is possible to improve driving durability and the like.

The complex stability constant K1 is a constant determined by the relationship between a ligand and a metal atom which is a target of the coordinate bond, and it is represented by Expression (b).

$$\text{Complex stability constant} K1 = [ML]/([M] \times [L]) \quad (b)$$

In Expression (b), [ML] represents the molar concentration of a complex formed by bonding a metal atom to a ligand, [M] represents the molar concentration of a metal atom contributing to the coordinate bond, and [L] represents the molar concentration of the ligand.

Practically, a plurality of ligands may be coordinated to one metal atom. However, in the present invention, the complex stability constant K1 represented by Expression (b) in a case where one ligand molecule is coordinated to one metal atom is defined as an indicator of the strength of the coordinate bond.

The complex stability constant K1 between the ligand and the metal atom can be determined by spectroscopy, magnetic resonance spectroscopy, potentiometry, solubility measurement, chromatography, calorimetry, solidifying point measurement, vapor pressure measurement, relaxation measurement, viscosity measurement, surface tension measurement, or the like. In the present invention, the complex stability constant K1 is determined using Sc-Database ver. 5.85 (Academic Software) (2010), which summarizes results from various methods and research institutes. In a case where the complex stability constant K1 is not present in the Sc-Database ver. 5.85, a value described in Critical Stability Constants, written by A. E. Martell and R. M. M. Smith, is used. In a case where the complex stability constant K1 is not described in the Critical Stability Constants, the above-described measurement method is used or a program PKAS method that calculates the complex stability constant K1 (The Determination and Use of Stability Constants, VCH (1988) written by A. E. Martell et. al.) is used to calculate the complex stability constant K1.

In the present invention, a quantum dot containing a Pb atom (more preferably, PbS is used) is used as the semiconductor quantum dot QD1, and the complex stability constant K1 of the polydentate ligand with respect to the Pb atom is preferably 6 or more, more preferably 8 or more, and still more preferably 9 or more. Examples of the compound having a complex stability constant K1 of 6 or more with respect to the Pb atom include thioglycolic acid (complex stability constant K1 with respect to Pb=8.5) and 2-mercaptoethanol (complex stability constant K1 with respect to Pb=6.7).

The thickness of the photoelectric conversion layer is preferably 10 to 600 nm, more preferably 50 to 600 nm, still more preferably 100 to 600 nm, and even still more preferably 150 to 600 nm. The upper limit of the thickness is preferably 550 nm or less, more preferably 500 nm or less, and still more preferably 450 nm or less.

The refractive index of the photoelectric conversion layer with respect to light of the target wavelength to be detected by the photodetector element is preferably 2.0 to 3.0, more preferably 2.1 to 2.8, and still more preferably 2.2 to 2.7. According to this aspect, in a case where the configuration of the photodetector element is a photodiode, it is easy to realize a high light absorbance, that is, a high external quantum efficiency.

(Hole Transport Layer)

In the photodetector element according to the embodiment of the present invention, a hole transport layer (hereinafter, also referred to as a "hole transport layer QD") containing an aggregate of semiconductor quantum dots QD2 that contains a metal atom and containing a ligand L2 that is coordinated to the semiconductor quantum dot QD2 is arranged on the photoelectric conversion layer. The hole transport layer is a layer having a function of transporting holes generated in the photoelectric conversion layer to the electrode. The hole transport layer is also called an electron block layer. In the photodetector element according to the embodiment of the present invention, it is preferable that the hole transport layer QD is arranged on the surface of the photoelectric conversion layer.

The hole transport layer QD contains aggregates of the semiconductor quantum dots QD2 containing a metal atom. The semiconductor quantum dot QD2 is a semiconductor particle having a metal atom. The details of the semiconductor quantum dot QD2 are synonymous with the semiconductor quantum dot QD1. The semiconductor quantum dot QD2 preferably contains at least one metal atom selected from a Pb atom, an In atom, a Ge atom, a Si atom, a Cd atom, a Zn atom, a Hg atom, an Al atom, a Sn atom, or a Ga atom, more preferably at least one metal atom selected from a Pb atom, an In atom, a Ge atom, or a Si atom, and due to the reason that the effects of the present invention are easily obtained more remarkably, it still more preferably contains a Pb atom.

Specific examples of the semiconductor quantum dot material that constitutes the semiconductor quantum dot QD2 include semiconductor materials having a relatively narrow band gap, such as PbS, PbSe, InN, InAs, Ge, InAs, InGaAs, CuInS, CuInSe, CuInGaSe, InSb, Si, and InP. Among them, the semiconductor quantum dot QD2 preferably contains PbS or PbSe and more preferably contains PbS. In addition, the semiconductor quantum dot QD2 preferably contains the same kind of semiconductor quantum dot as the semiconductor quantum dot QD1 contained in the photoelectric conversion layer. The same kind of semiconductor quantum dot is a semiconductor quantum dot consisting of the same material. For example, it means that the semiconductor quantum dot materials constituting the semiconductor quantum dot QD1 and the semiconductor quantum dot QD2 are both PbS.

The semiconductor quantum dot QD2 may be a material having a core-shell structure in which a semiconductor quantum dot material is made to the nucleus (the core) and the semiconductor quantum dot material is covered with a coating compound. Examples of the coating compound include ZnS, ZnSe, ZnTe, and ZnCdS.

The band gap of the semiconductor quantum dot QD2 is preferably 0.5 to 2.0 eV. In a case where the band gap of the semiconductor quantum dot is within the above range, it is possible to obtain a photodetector element capable of detecting light of various wavelengths depending on the use application. For example, it is possible to obtain a photodetector element capable of detecting light in the infrared region. The upper limit of the band gap of the semiconductor quantum dot QD2 is preferably 1.9 eV or less, more preferably 1.8 eV or less, and still more preferably 1.5 eV or less. The lower limit of the band gap of the semiconductor quantum dot QD2 is preferably 0.6 eV or more and more preferably 0.7 eV or more.

The average particle diameter of the semiconductor quantum dots QD2 is preferably 2 nm to 15 nm.

The hole transport layer QD contains the ligand L2 that is coordinated to the semiconductor quantum dot QD2. The ligand L2 includes a ligand represented by any one of Formulae (A) to (C).

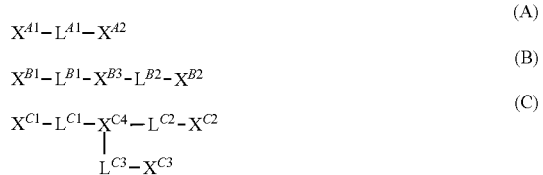

(A) $X^{A1}\text{-}L^{A1}\text{-}X^{A2}$ (B) $X^{B1}\text{-}L^{B1}\text{-}X^{B3}\text{-}L^{B2}\text{-}X^{B2}$ (C) $X^{C1}\text{-}L^{C1}\text{-}X^{C4}\text{-}L^{C2}\text{-}X^{C2}$
       $\quad\quad\quad\;\;|$
       $\quad\quad\;\;L^{C3}\text{-}X^{C3}$ In Formula (A), $X^{A1}$ and $X^{A2}$ each independently represent a thiol group, an amino group, a hydroxy group, a carboxy group, a sulfo group, a phospho group, or a phosphonic acid group, and $L^{A1}$ represents a hydrocarbon group, where $X^{A1}$ is a group different from $X^{A2}$;

in Formula (B), $X^{B1}$ and $X^{B2}$ each independently represent a thiol group, an amino group, a hydroxy group, a carboxy group, a sulfo group, a phospho group, or a phosphonic acid group, $X^{B3}$ represents S, O, or NH, and $L^{B1}$ and $L^{B2}$ each independently represent a hydrocarbon group;

in Formula (C), $X^{C1}$ to $X^{C3}$ each independently represent a thiol group, an amino group, a hydroxy group, a carboxy group, a sulfo group, a phospho group, or a phosphonic acid group, $X^{C4}$ represents N, and $L^{C1}$ to $L^{C3}$ each independently represent a hydrocarbon group.

The amino group represented by $X^{A1}$, $X^{A2}$, $X^{B1}$, $X^{B2}$, $X^{C1}$, $X^{C2}$, or $X^{C3}$ is not limited to —$NH_2$ and includes a substituted amino group and a cyclic amino group as well. Examples of the substituted amino group include a monoalkylamino group, a dialkylamino group, a monoarylamino group, a diarylamino group, and an alkylarylamino group. The amino group represented by these groups is preferably —$NH_2$, a monoalkylamino group, or a dialkylamino group, and —$NH_2$ is more preferable.

The hydrocarbon group represented by $L^{A1}$, $L^{B1}$, $L^{B2}$, $L^{C1}$, $L^{C2}$, or $L^{C3}$ is preferably an aliphatic hydrocarbon group. The aliphatic hydrocarbon group may be a saturated aliphatic hydrocarbon group or may be an unsaturated aliphatic hydrocarbon group. The hydrocarbon group preferably has 1 to 20 carbon atoms. The upper limit of the number of carbon atoms is preferably 10 or less, more preferably 6 or less, and still more preferably 3 or less. Specific examples of the hydrocarbon group include an alkylene group, an alkenylene group, and an alkynylene group.

Examples of the alkylene group include a linear alkylene group, a branched alkylene group, and a cyclic alkylene group. A linear alkylene group or a branched alkylene group is preferable, and a linear alkylene group is more preferable. Examples of the alkenylene group include a linear alkenylene group, a branched alkenylene group, and a cyclic alkenylene group. A linear alkenylene group or a branched alkenylene group is preferable, and a linear alkenylene group is more preferable. Examples of the alkynylene group include a linear alkynylene group and a branched alkynylene group, and a linear alkynylene group is preferable. The alkylene group, the alkenylene group, and the alkynylene group may further have a substituent. The substituent is preferably a group having 1 or more and 10 or less atoms. Preferred specific examples of the group having 1 or more and 10 or less atoms include the group described as the specific example of the above-described group having 1 or more and 10 or less atoms.

In Formula (A), it is preferable that one of $X^{A1}$ and $X^{A2}$ is a thiol group. Among the above, it is more preferable that one of $X^{A1}$ and $X^{A2}$ is a thiol group and the other is an amino group, a hydroxy group, or a carboxy group.

In Formula (A), $X^{A1}$ and $X^{A2}$ are separated by $L^{A1}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

In Formula (B), it is preferable that at least one of $X^{B1}$ and $X^{B2}$ is a thiol group due to the reason that it is easy to increase the external quantum efficiency. In addition, $X^{B3}$ is preferably O or NH, and more preferably NH.

In Formula (B), $X^{B1}$ and $X^{B3}$ are separated by $L^{B1}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms. In addition, $X^{B2}$ and $X^{B3}$ are separated by $L^{B2}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

In Formula (C), it is preferable that at least one of $X^{C1}$ to $X^{C3}$ is a thiol group due to the reason that it is easy to increase the external quantum efficiency.

In Formula (C), $X^{C1}$ and $X^{C4}$ are separated by $L^{C1}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms. In addition, $X^{C2}$ and $X^{C4}$ are separated by $L^{C2}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms. In addition, $X^{C3}$ and $X^{C4}$ are separated by $L^{C3}$ preferably by 1 to 10 atoms, more preferably separated by 1 to 6 atoms, still more preferably separated by 1 to 4 atoms, even still more preferably separated by 1 to 3 atoms separated, and particularly preferably separated by 1 or 2 atoms.

The meanings that $X^{A1}$ and $X^{A2}$ are separated by $L^{A1}$ by 1 to 10 atoms, $X^{B1}$ and $X^{B3}$ are separated by $L^{B1}$ by 1 to 10 atoms, $X^{B2}$ and $X^{B3}$ are separated by $L^{B2}$ by 1 to 10 atoms, $X^{C1}$ and $X^{C4}$ are separated by $L^{C1}$ by 1 to 10 atoms, $X^{C2}$ and $X^{C4}$ are separated by $L^{C2}$ by 1 to 10 atoms, and $X^{C3}$ and $X^{C4}$ are separated by $L^{C3}$ by 1 to 10 atoms are the same as those described in the section of ligand L1.

Specific examples of the ligand L2 include the compounds described in the specific examples of the ligand L1 described above, thioglycolic acid, 3-mercaptopropionic acid, 2-aminoethanol, 2-aminoethanethiol, 2-mercaptoethanol, glycolic acid, 4-mercaptobutanoic acid, 3-aminopropanol, 3-mercaptopropanol, N-(3-aminopropyl)-1,3-propanediamine, or 3-(bis(3-aminopropyl)amino)propane-1-ol is preferable, thioglycolic acid, 3-mercaptopropionic acid, 2-aminoethanethiol, or 2-mercaptoethanol is more preferable, and thioglycolic acid, or 3-mercaptopropionic acid is still more preferable.

The thickness of the hole transport layer QD is preferably 5 to 100 nm. The lower limit is preferably 10 nm or more. The upper limit is preferably 50 nm or less and more preferably 30 nm or less.

The photoelectric conversion layer and the hole transport layer can be formed by undergoing a step (a semiconductor quantum dot aggregate forming step) of applying a semiconductor quantum dot dispersion liquid containing semiconductor quantum dots, a ligand that is coordinated to the semiconductor quantum dot, and a solvent onto a substrate to form a film of aggregates of the semiconductor quantum dots. The method for applying a semiconductor quantum dot dispersion liquid onto a substrate is not particularly limited. Examples thereof include coating methods such as a spin coating method, a dipping method, an inkjet method, a dispenser method, a screen printing method, a relief printing method, an intaglio printing method, and a spray coating method.

In addition, after forming a film of aggregates of the semiconductor quantum dots, a ligand exchange step may be further carried out to exchange the ligand coordinated to the semiconductor quantum dot with another ligand. In the ligand exchange step, a ligand solution containing a ligand A and a solvent is applied onto the film of aggregates of the semiconductor quantum dots, formed by the semiconductor quantum dot aggregate forming step, to exchange the ligand coordinated to the semiconductor quantum dot with the ligand A. The ligand A may contain two or more kinds of ligands, and two kinds of ligand solutions may be used in combination.

On the other hand, a desired ligand may be applied onto the surface of the semiconductor quantum dot in advance in the semiconductor quantum dot dispersion liquid, and this dispersion liquid may be applied onto the substrate to form a photoelectric conversion layer and a hole transport layer.

The content of the semiconductor quantum dot in the semiconductor quantum dot dispersion liquid is preferably 1 to 500 mg/mL, more preferably 10 to 200 mg/mL, and still more preferably 20 to 100 mg/mL.

Examples of the solvent contained in the semiconductor quantum dot dispersion liquid and the ligand solution include an ester-based solvent, a ketone-based solvent, an alcohol-based solvent, an amide-based solvent, an ether-based solvent, and a hydrocarbon-based solvent. For details thereof, paragraph No. 0223 of WO2015/166779A can be referenced, the content of which is incorporated in the present specification. In addition, an ester-based solvent substituted with a cyclic alkyl group and a ketone-based solvent substituted with a cyclic alkyl group can also be used. It is preferable that the solvent has a small amount of metal impurities, and the metal content is, for example, 10 ppb (parts per billion) by mass or less. A solvent of a level of ppt (parts per trillion) by mass may be used as necessary, and such a solvent is provided by, for example, TOAGOSEI Co., Ltd. (The Chemical Daily, Nov. 13, 2015). Examples of the method for removing impurities such as metals from the solvent include distillation (molecular distillation, thin film distillation, and the like) and filtration using a filter. The filter pore diameter of the filter that is used for filtration is preferably 10 μm or less, more preferably 5 μm or less, and still more preferably 3 μm or less. A material of the filter is preferably polytetrafluoroethylene, polyethylene, or nylon. The solvent may contain isomers (compounds having the same number of atoms but having different structures). In addition, only one kind of isomer may be contained, or a plurality of kinds thereof may be contained.

The photodetector element according to the embodiment of the present invention may have another hole transport layer composed of a hole transport material different from the hole transport layer QD. Examples of the hole transport material constituting the other hole transport layer include PEDOT:PSS (poly(3,4-ethylenedioxythiophene):poly(4-styrenesulfonic acid)) and $MoO_3$. In addition, the organic hole transport material disclosed in paragraph Nos. 0209 to 0212 of JP2001-291534A can also be used.

In a case where the photodetector element according to the embodiment of the present invention includes the other hole transport layer, it is preferable that the hole transport layer QD is arranged on the side of the photoelectric conversion layer, and the other hole transport layer is arranged on the hole transport layer QD.

The photodetector element according to the embodiment of the present invention may further have a blocking layer and an electron transport layer. The blocking layer is a layer having a function of preventing a reverse current. The blocking layer is also called a short circuit prevention layer. Examples of the material that forms the blocking layer include silicon oxide, magnesium oxide, aluminum oxide, calcium carbonate, cesium carbonate, polyvinyl alcohol, polyurethane, titanium oxide, tin oxide, zinc oxide, niobium oxide, and tungsten oxide. The blocking layer may be a single-layer film or a laminated film having two or more layers. The electron transport layer is a layer having a function of transporting electrons generated in the photoelectric conversion layer to the electrode. The electron transport layer is also called a hole block layer. The electron transport layer is formed of an electron transport material capable of exhibiting this function. Examples of the electron transport material include a fullerene compound such as [6,6]-phenyl-$C_{61}$-butyric acid methyl ester ($PC_{61}BM$), a perylene compound such as perylenetetracarboxylic diimide, tetracyanoquinodimethane, titanium oxide, tin oxide, zinc oxide, indium oxide, indium tungsten oxide, indium zinc oxide, indium tin oxide, and fluorine-doped tin oxide. The electron transport layer may be a single-layer film or a laminated film having two or more layers.

The photodetector element according to the embodiment of the present invention is preferably used as an element that detects light having a wavelength in the infrared region. That is, the photodetector element according to the embodiment of the present invention is preferably an infrared photodetector element. In addition, the target light to be detected by the above-described photodetector element is preferably light having a wavelength in the infrared region. In addition, the light having a wavelength in the infrared region is preferably light having a wavelength of more than 700 nm, more preferably light having a wavelength of 800 nm or more, and still more preferably light having a wavelength of 900 nm or more. In addition, the light having a wavelength in the infrared region is preferably light having a wavelength of 2,000 nm or less, more preferably light having a wavelength of 1,800 nm or less, and still more preferably light having a wavelength of 1,600 nm or less.

In addition, the photodetector element according to the embodiment of the present invention may simultaneously detect light having a wavelength in the infrared region and light having a wavelength in the visible region (preferably light having a wavelength in a range of 400 to 700 nm).

Examples of the type of photodetector element include a photoconductor-type photodetector element and a photodiode-type photodetector element. Among the above, a photodiode-type photodetector element is preferable due to the reason that a high signal-to-noise ratio (SN ratio) is easily obtained.

FIG. 1 illustrates an embodiment of a photodiode-type photodetector element. It is noted that an arrow in the figure represents the incidence ray on the photodetector element. A photodetector element 1 illustrated in FIG. 1 includes a lower electrode 12, an upper electrode 11 opposite to the lower electrode 12, and a photoelectric conversion layer 13 provided between the lower electrode 12 and the upper electrode 11, and a hole transport layer 14 provided between the lower electrode 12 and the photoelectric conversion layer 13. The photodetector element 1 illustrated in FIG. 1 is used by causing light to be incident from above the upper electrode 11.

The photoelectric conversion layer 13 is a photoelectric conversion layer containing aggregates of semiconductor quantum dots QD1 that contain a metal atom and containing a ligand L1 that is coordinated to the semiconductor quantum dot QD1. In addition, the hole transport layer 14 is a hole transport layer containing aggregates of semiconductor quantum dots QD2 that contains a metal atom and containing a ligand L2 that is coordinated to the semiconductor quantum dot QD2. These details and preferred aspects thereof are as described above.

In addition, a wavelength $\lambda$ of the target light to be detected by the photodetector element and an optical path length $L^\lambda$ of the light having the wavelength $\lambda$ from a surface 12a of the lower electrode 12 on a side of the photoelectric conversion layer 13 to a surface 13a of the photoelectric conversion layer 13 on a side of the upper electrode layer preferably satisfy the relationship of Expression (1-1), and more preferably satisfy the relationship of Expression (1-2). In a case where the wavelength $\lambda$ and the optical path length LA satisfy such a relationship, in the photoelectric conversion layer 13, it is possible to arrange a phase of the light (the incidence ray) incident from the side of the upper electrode 11 and a phase of the light (the reflected light) reflected on the surface of the lower electrode 12, and as a result, the light is intensified by the optical interference effect, whereby it is possible to obtain a higher external quantum efficiency.

$$0.05+m/2 \leq L^\lambda/\lambda \leq 0.35+m/2 \quad (1\text{-}1)$$

$$0.10+m/2 \leq L^\lambda/\lambda \leq 0.30+m/2 \quad (1\text{-}2)$$

In the above expressions, A is the wavelength of the target light to be detected by the photodetector element, $L^\lambda$ is the optical path length of light having a wavelength $\lambda$ from a surface 12a of the lower electrode 12 on a side of the photoelectric conversion layer 13 to a surface 13a of the photoelectric conversion layer 13 on a side of the upper electrode layer, and m is an integer of 0 or more.

m is preferably an integer of 0 to 4, more preferably an integer of 0 to 3, and still more preferably an integer of 0 to 2. According to this aspect, the transport characteristics of charges such as the hole and the electron are good, and thus it is possible to increase the external quantum efficiency of the photodetector element.

Here, the optical path length means the product obtained by multiplying the physical thickness of a substance through which light transmits by the refractive index. To describe with the photoelectric conversion layer 13 as an example, in a case where the thickness of the photoelectric conversion layer is denoted by $d^1$ and the refractive index of the photoelectric conversion layer with respect to the wavelength $\lambda^1$ is denoted by N1, the optical path length of the light having a wavelength $\lambda^1$ and transmitting through the photoelectric conversion layer 13 is $N^1 \times d^1$. In a case where the photoelectric conversion layer 13 or the hole transport layer 14 is composed of two or more laminated films or in a case where an interlayer is present between the hole transport layer 14 and the lower electrode 12, the integrated value of the optical path length of each layer is the optical path length La.

The upper electrode 11 is preferably a transparent electrode formed of a conductive material that is substantially transparent with respect to the wavelength of the target light to be detected by the photodetector element. It is noted that in the present invention, the description of "substantially transparent" means that the light transmittance is 50% or more, preferably 60% or more, and particularly preferably 80% or more. Examples of the material of the upper electrode 11 include a conductive metal oxide. Specific examples thereof include tin oxide, zinc oxide, indium oxide, indium tungsten oxide, indium zinc oxide (IZO), indium tin oxide (ITO), and a fluorine-doped tin oxide (FTO).

The film thickness of the upper electrode 11 is not particularly limited, and it is preferably 0.01 to 100 μm, more preferably 0.01 to 10 μm, and particularly preferably 0.01 to 1 μm. It is noted that in the present invention, the thickness of each layer can be measured by observing the cross section of the photodetector element 1 using a scanning electron microscope (SEM) or the like.

Examples of the material that forms the lower electrode 12 include a metal such as platinum, gold, nickel, copper, silver, indium, ruthenium, palladium, rhodium, iridium, osmium, or aluminum, the above-described conductive metal oxide, a carbon material, and a conductive polymer. The carbon material may be any material having conductivity, and examples thereof include fullerene, a carbon nanotube, graphite, and graphene.

The lower electrode 12 is preferably a thin film of a metal or conductive metal oxide (including a thin film formed by vapor deposition), or a glass substrate or plastic substrate having this thin film. The glass substrate or the plastic substrate is preferably glass having a thin film of gold or platinum, or glass on which platinum is vapor-deposited. The film thickness of the lower electrode 12 is not particularly limited, and it is preferably 0.01 to 100 μm, more preferably 0.01 to 10 μm, and particularly preferably 0.01 to 1 μm.

Although not illustrated in the drawing, a transparent substrate may be arranged on the surface of the upper electrode 11 on the light incident side (the surface opposite to the side of the photoelectric conversion layer 13). Examples of the kind of transparent substrate include a glass substrate, a resin substrate, and a ceramic substrate.

In addition, although not illustrated in the drawing, a blocking layer or the other hole transport layer described above may be provided between the hole transport layer 14 and the lower electrode 12.

In addition, a blocking layer or an electron transport layer may be provided between the photoelectric conversion layer 13 and the upper electrode 11.

Figure 2:
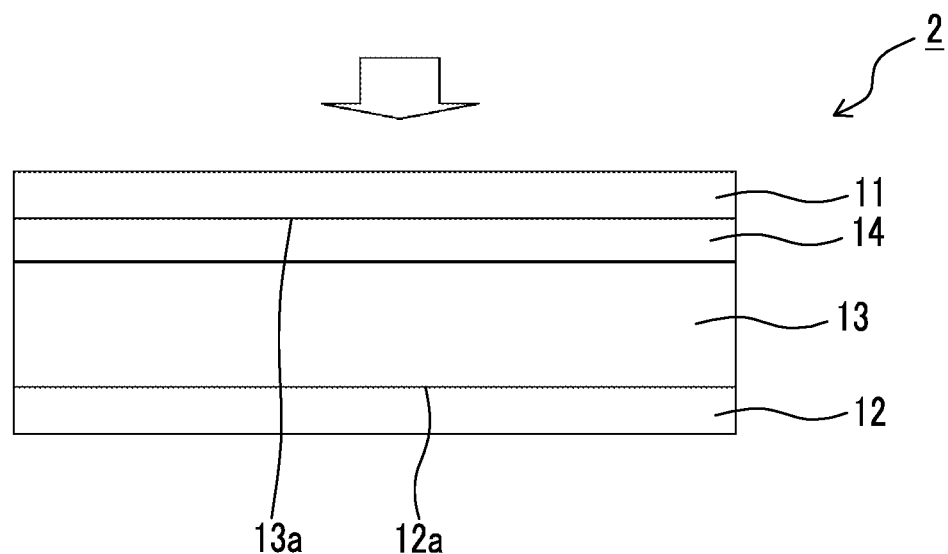
FIG. 2 is a diagram illustrating another embodiment of a photodetector element.

FIG. 2 illustrates another embodiment of the photodiode-type photodetector element. The photodetector element 1 illustrated in FIG. 2 is the same as the photodetector element of the embodiment illustrated in FIG. 1 except that the hole transport layer 14 is provided between the upper electrode 11 and the photoelectric conversion layer 13.

Although not illustrated in the drawing, a transparent substrate may be arranged on the surface of the upper electrode 11 on the light incident side (the surface opposite to the side of the hole transport layer 14). Examples of the kind of transparent substrate include a glass substrate, a resin substrate, and a ceramic substrate. In addition, although not illustrated in the drawing, a blocking layer or the other hole transport layer described above may be provided between the hole transport layer 14 and the upper electrode 11. In addition, a blocking layer or an electron transport layer may be provided between the photoelectric conversion layer 13 and the lower electrode 12.

<Image Sensor>

The image sensor according to the embodiment of the present invention includes the above-described photodetector element according to the embodiment of the present invention. The configuration of the image sensor is not particularly limited as long as it has the photodetector element according to the embodiment of the present invention and it is a configuration that functions as an image sensor.

The image sensor according to the embodiment of the present invention may include an infrared transmission filter layer. The infrared transmission filter layer preferably has a low light transmittance in the wavelength range of the visible region, more preferably has an average light transmittance of 10% or less, still more preferably 7.5% or less, and particularly preferably 5% or less in a wavelength range of 400 to 650 nm.

Examples of the infrared transmission filter layer include those composed of a resin film containing a coloring material. Examples of the coloring material include a chromatic coloring material such as a red coloring material, a green coloring material, a blue coloring material, a yellow coloring material, a purple coloring material, and an orange coloring material, and a black coloring material. It is preferable that the coloring material contained in the infrared transmission filter layer forms a black color with a combination of two or more kinds of chromatic coloring materials or a coloring material containing a black coloring material. Examples of the combination of the chromatic coloring material in a case of forming a black color by a combination of two or more kinds of chromatic coloring materials include the following aspects (C1) to (C7).

(C1) an aspect containing a red coloring material and a blue coloring material.

(C2) an aspect containing a red coloring material, a blue coloring material, and a yellow coloring material.

(C3) an aspect containing a red coloring material, a blue coloring material, a yellow coloring material, and a purple coloring material.

(C4) an aspect containing a red coloring material, a blue coloring material, a yellow coloring material, a purple coloring material, and a green coloring material.

(C5) an aspect containing a red coloring material, a blue coloring material, a yellow coloring material, and a green coloring material.

(C6) an aspect containing a red coloring material, a blue coloring material, and a green coloring material.

(C7) an aspect containing a yellow coloring material and a purple coloring material.

The chromatic coloring material may be a pigment or a dye. The infrared transmission filter layer may contain a pigment and a dye. The black coloring material is preferably an organic black coloring material. Examples of the organic black coloring material include a bisbenzofuranone compound, an azomethine compound, a perylene compound, and an azo compound.

The infrared transmission filter layer may further contain an infrared absorber. In a case where the infrared absorber is contained in the infrared transmission filter layer, the wavelength of the light to be transmitted can be shifted to the longer wavelength side. Examples of the infrared absorber include a pyrrolo pyrrole compound, a cyanine compound, a squarylium compound, a phthalocyanine compound, a naphthalocyanine compound, a quaterrylene compound, a merocyanine compound, a croconium compound, an oxonol compound, an iminium compound, a dithiol compound, a triarylmethane compound, a pyrromethene compound, an azomethine compound, an anthraquinone compound, a dibenzofuranone compound, a dithiolene metal complex, a metal oxide, and a metal boride.

The spectral characteristics of the infrared transmission filter layer can be appropriately selected according to the use application of the image sensor. Examples of the filter layer include those that satisfy any one of the following spectral characteristics of (1) to (5).

(1): A filter layer in which the maximum value of the light transmittance in the film thickness direction in a wavelength range of 400 to 750 nm is 20% or less (preferably 15% or less and more preferably 10% or less), and the minimum value of the light transmittance in the film thickness direction in a wavelength range of 900 to 1,500 nm is 70% or more (preferably 75% or more and more preferably 80% or more).

(2): A filter layer in which the maximum value of the light transmittance in the film thickness direction in a wavelength range of 400 to 830 nm is 20% or less (preferably 15% or less and more preferably 10% or less), and the minimum value of the light transmittance in the film thickness direction in a wavelength range of 1,000 to 1,500 nm is 70% or more (preferably 75% or more and more preferably 80% or more).

(3): A filter layer in which the maximum value of the light transmittance in the film thickness direction in a wavelength range of 400 to 950 nm is 20% or less (preferably 15% or less and more preferably 10% or less), and the minimum value of the light transmittance in the film thickness direction in a wavelength range of 1,100 to 1,500 nm is 70% or more (preferably 75% or more and more preferably 80% or more).

(4): A filter layer in which the maximum value of the light transmittance in the film thickness direction in a wavelength range of 400 to 1,100 nm is 20% or less (preferably 15% or less and more preferably 10% or less), and the minimum value thereof in a wavelength range of 1,400 to 1,500 nm is 70% or more (preferably 75% or more and more preferably 80% or more).

(5): A filter layer in which the maximum value of the light transmittance in the film thickness direction in a wavelength range of 400 to 1,300 nm is 20% or less (preferably 15% or less and more preferably 10% or less), and the minimum value thereof in a wavelength range of 1,600 to 2,000 nm is 70% or more (preferably 75% or more and more preferably 80% or more).

Further, as the infrared transmission filter, the films disclosed in JP2013-077009A, JP2014-130173A, JP2014-130338A, WO2016/178346A, WO2015/166779A, WO2016/190162A, WO2018/016232A, JP2016-177079A, JP2014-130332A, and WO2016/027798A can be used. In addition, as the infrared transmission filter, two or more filters may be used in combination, or a dual bandpass filter that transmits through two or more specific wavelength regions with one filter may be used.

The image sensor according to the embodiment of the present invention may include an infrared shielding filter for the intended purpose of improving various performances such as noise reduction. Specific examples of the infrared shielding filter include the filters disclosed in WO2016/186050A, WO2016/035695A, JP6248945B, WO2019/021767A, JP2017-067963A, and JP6506529B.

The image sensor according to the embodiment of the present invention may include a dielectric multi-layer film. Examples of the dielectric multi-layer film include those in which a plurality of layers are laminated by alternately laminating a dielectric thin film having a high refractive index (a high refractive index material layer) and a dielectric thin film having a low refractive index (a low refractive index material layer). The number of laminated layers of the dielectric thin film in the dielectric multi-layer film is not particularly limited; however, it is preferably 2 to 100 layers, more preferably 4 to 60 layers, and still more preferably 6 to 40 layers. The material that is used for forming the high refractive index material layer is preferably a material having a refractive index of 1.7 to 2.5. Specific examples thereof include $Sb_2O_3$, $Sb_2S_3$, $Bi_2O_3$, $CeO_2$, $CeF_3$, $HfO_2$, $La_2O_3$, $Nd_2O_3$, $Pr_6On$, $Sc_2O_3$, SiO, $Ta_2O_5$, $TiO_2$, TlCl, $Y_2O_3$, ZnSe, ZnS, and $ZrO_2$. The material that is used for forming the low refractive index material layer is preferably a material having a refractive index of 1.2 to 1.6. Specific examples thereof include $Al_2O_3$, $BiF_3$, $CaF_2$, $LaF_3$, $PbCl_2$, $PbF_2$, LiF, $MgF_2$, MgO, $NdF_3$, $SiO_2$, $Si_2O_3$, NaF, $ThO_2$, $ThF_4$, and $Na_3AlF_6$. The method for forming the dielectric multi-layer film is not particularly limited; however, examples thereof include ion plating, a vacuum deposition method using an ion beam or the like, a physical vapor deposition method (a PVD method) such as sputtering, and a chemical vapor deposition method (a CVD method). The thickness of each of the high refractive index material layer and the low refractive index material layer is preferably $0.1\lambda$ to $0.5\lambda$ in a case where the wavelength of the light to be blocked is $\lambda$(nm). Specific examples of the dielectric multi-layer film include the dielectric multi-layer films disclosed in JP2014-130344A and JP2018-010296A.

In the dielectric multi-layer film, the transmission wavelength range is preferably present in the infrared region (preferably a wavelength range having a wavelength of more than 700 nm, more preferably a wavelength range having a wavelength of more than 800 nm, and still more preferably a wavelength range having a wavelength of more than 900 nm). The maximum transmittance in the transmission wavelength range is preferably 70% or more, more preferably 80% or more, and still more preferably 90% or more. In addition, the maximum transmittance in the shielding wavelength range is preferably 20% or less, more preferably 10% or less, and still more preferably 5% or less. In addition, the average transmittance in the transmission wavelength range is preferably 60% or more, more preferably 70% or more, and still more preferably 80% or more. In addition, in a case where the wavelength at which the maximum transmittance is exhibited is denoted by a central wavelength $\lambda_{t1}$, the wavelength range of the transmission wavelength range is preferably "the central wavelength $\lambda_{t1} \pm 100$ nm", more preferably "the central wavelength $\lambda_{t1} \pm 75$ nm", and still more preferably "the central wavelength $\lambda_{t1} \pm 50$ nm".

The dielectric multi-layer film may have only one transmission wavelength range (preferably, a transmission wavelength range having a maximum transmittance of 90% or more) or may have a plurality of transmission wavelength ranges.

The image sensor according to the embodiment of the present invention may include a color separation filter layer. Examples of the color separation filter layer include a filter layer including colored pixels. Examples of the kind of colored pixel include a red pixel, a green pixel, a blue pixel, a yellow pixel, a cyan pixel, and a magenta pixel. The color separation filter layer may include colored pixels having two or more colors or having only one color. It can be appropriately selected according to the use application and the intended purpose. As the color separation filter layer, for example, the filter disclosed in WO2019/039172A can be used.

In addition, in a case where the color separation layer includes colored pixels having two or more colors, the colored pixels of the respective colors may be adjacent to each other, or a partition wall may be provided between the respective colored pixels. The material of the partition wall is not particularly limited. Examples thereof include an organic material such as a siloxane resin or a fluororesin, and an inorganic particle such as a silica particle. In addition, the partition wall may be composed of a metal such as tungsten or aluminum.

In a case where the image sensor according to the embodiment of the present invention includes an infrared transmission filter layer and a color separation layer, it is preferable that the color separation layer is provided on an optical path different from the infrared transmission filter layer. In addition, it is also preferable that the infrared transmission filter layer and the color separation layer are arranged two-dimensionally. The fact that the infrared transmission filter layer and the color separation layer are two-dimensionally arranged means that at least a part of both is present on the same plane.

The image sensor according to the embodiment of the present invention may include an interlayer such as a planarizing layer, an underlying layer, or an intimate attachment layer, an anti-reflection film, and a lens. As the anti-reflection film, for example, a film prepared from the composition disclosed in WO2019/017280A can be used. As the lens, for example, the structure disclosed in WO2018/092600A can be used.

The photodetector element according to the embodiment of the present invention has excellent sensitivity to light having a wavelength in the infrared region. As a result, the image sensor according to the embodiment of the present invention can be preferably used as an infrared image sensor. In addition, the image sensor according to the embodiment of the present invention can be preferably used as a sensor that senses light having a wavelength of 900 to 2,000 nm and can be more preferably used as a sensor that senses light having a wavelength of 900 to 1,600 nm.

EXAMPLES

Hereinafter, the present invention will be described more specifically with reference to Examples. Materials, amounts used, proportions, treatment details, treatment procedures, and the like shown in the following examples can be appropriately changed without departing from the gist of the present invention. Accordingly, a scope of the present invention is not limited to the following specific examples.

(Preparation of Dispersion Liquid of PbS Quantum Dots)

6.74 mL of oleic acid, 6.3 mmol of lead oxide, and 30 mL of octadecene were weighed and taken in a flask and heated at 120° C. under vacuum for 100 minutes to obtain a precursor solution. Then, the temperature of the solution was adjusted to 100° C., the system subsequently was made into a nitrogen flow state, and subsequently, 2.5 mmol of hexamethyldisilathiane was injected together with 5 mL of octadecene.

After holding for 1 minute after the injection, the flask was naturally cooled, and at the stage where the temperature reached 30° C., 40 mL of toluene was added thereto, and a solution was recovered. An excess amount of ethanol was added to the solution, centrifugation was carried out at 10,000 rpm for 10 minutes, and the precipitate was dispersed in octane, to obtain a dispersion liquid (concentration: 40 mg/mL) of PbS quantum dots, in which oleic acid was coordinated as a ligand on the surface of the PbS quantum dot. The band gap of the PbS quantum dot in the obtained dispersion liquid of PbS quantum dot was estimated from light absorption measurement in the visible to infrared region by using an ultraviolet-visible-near-infrared spectrophotometer (V-670, manufactured by JASCO Corporation), and it was approximately 1.32 eV.

(Preparation of Photodetector Element) [Examples 1 and 2, and Comparative Example 1]

A titanium oxide film of 50 nm was formed by sputtering on a quartz glass substrate attached with a fluorine-doped tin oxide film. Next, the above dispersion liquid of PbS quantum dots was added dropwise onto the titanium oxide film formed on the substrate, and spin coating was carried out at 2,500 rpm to form a PbS quantum dot aggregate film (a step PC1). Next, a solution containing 25 mmol/L of a concentration of zinc iodide and 0.01% by volume of a concentration of 3-mercaptopropionic acid in methanol was added as the ligand solution dropwise onto the PbS quantum dot aggregate film, allowed to stand for 1 minute, and spin drying was carried out at 2,500 rpm. Next, methanol was added dropwise onto the PbS quantum dot aggregate film, and spin drying was carried at 2,500 rpm for 20 seconds to carry out the ligand exchange of the ligand coordinated to the PbS quantum dot from oleic acid to 3-mercaptopropionic acid and zinc iodide (a step PC2). The operation of the step PC1 and step PC2 as one cycle was repeated for 10 cycles, and a photoelectric conversion layer, which is the PbS quantum dot aggregate film in which the ligand had been subjected to ligand exchange from oleic acid to 3-mercaptopropionic acid and zinc iodide, was formed to a thickness of 200 nm.

Next, the above-described dispersion liquid of PbS quantum dots was added dropwise onto this photoelectric conversion layer, and spin coating was carried out at 2,500 rpm to form a PbS quantum dot aggregate film (a step HT1).

Next, as a ligand solution, a 0.01% by volume methanol solution of the ligand described in the table below was added dropwise, and after being allowed to stand for 1 minute, spin drying was carried out at 2,500 rpm. Next, methanol was added dropwise onto the PbS quantum dot aggregate film, and spin drying was carried at 2,500 rpm for 20 seconds to carry out the ligand exchange of the ligand coordinated to the PbS quantum dot from oleic acid to the ligand described in the table below (a step HT2). The operation of the step HT1 and step HT2 as one cycle was repeated for 2 cycles, and a hole transport layer, which is the PbS quantum dot aggregate film in which the ligand had been subjected to ligand exchange from oleic acid to the ligand described in the table below, was formed to a thickness of 40 nm.

Next, gold was formed on the hole transport layer by vapor deposition to a thickness of 100 nm through a metal mask in which three patterns of openings having an area of 0.16 cm$^2$ were formed to form three element parts, whereby a photodiode-type photodetector element was obtained.

<Evaluation of External Quantum Efficiency and in-Plane Uniformity>

The external quantum efficiency was measured when each photodetector element was irradiated with monochrome light (100 μW/cm$^2$) having a wavelength of 940 nm in a state where a reverse voltage of 2 V was applied thereto. The external quantum efficiency was estimated by "external quantum efficiency=(number of photoelectrons/number of irradiated photons)×100" from the number of photoelectrons estimated from the difference between a current value in a case of not being irradiated with light and a current value in a case of being irradiated with light, and the number of irradiated photons. The values of external quantum efficiency shown in the table below are the average values of the three element parts.

In addition, regarding in-plane uniformity, the external quantum efficiency of each of the three element parts was measured, and the difference between the value of the highest external quantum efficiency and the value of the lowest external quantum efficiency was calculated as ΔEQE (=the value of the highest external quantum efficiency—the value of the lowest external quantum efficiency), and the in-plane uniformity (the in-plane uniformity of the external quantum efficiency) was evaluated. It means that the smaller the value of ΔEQE, the better the in-plane uniformity.

TABLE 1

| | Kind of ligand of hole transport layer | External quantum efficiency [%] | In-plane uniformity (ΔEQE [%]) |
| --- | --- | --- | --- |
| Example 1 | Thioglycolic acid | 49.2 | 2.3 |
| Example 2 | 3-mercaptopropionic acid | 48.5 | 3.5 |
| Comparative Example 1 | Ethanethiol | 48.2 | 12.6 |

As shown in the above table, the photodetector element of Example was remarkably excellent in in-plane uniformity as compared with Comparative Example 1.

Examples 3 to 11

A photodetector element was prepared in the same manner as in Example 1 except that a 0.01% by volume methanol solution of the ligands described in the table below was used as the ligand solution that was used in step HT2 in Example 1. The in-plane uniformity of the obtained photodetector element was measured by the above method. The evaluation results are shown in the table below.

TABLE 2

| | Kind of ligand of hole transport layer | In-plane uniformity (ΔEQE [%]) |
| --- | --- | --- |
| Example 3 | 2-aminoethanol | 4.5 |
| Example 4 | 2-aminoethanethiol | 2.3 |
| Example 5 | 2-mercaptoethanol | 2 |
| Example 6 | glycolic acid | 4 |

TABLE 2-continued

|  | Kind of ligand of hole transport layer | In-plane uniformity (ΔEQE [%]) |
|---|---|---|
| Example 7 | 4-mercaptobutanoic acid | 3 |
| Example 8 | 3-aminopropanol | 3.1 |
| Example 9 | 3-mercaptopropanol | 2.9 |
| Example 10 | N-(3-aminopropyl)-1,3-propanediamine | 3.3 |
| Example 11 | 3-(bis(3-aminopropyl)amino)propane-1-ol | 3.2 |

In the photodetector elements of Examples 3 to 11, the in-plane uniformity was also remarkably excellent as compared with Comparative Example 1. In addition, the photodetector elements of Examples 3 to 11 had the same external quantum efficiency as the photodetector element of Example 1.

Example 12

A photodetector element was prepared in the same manner as in Example 1 except that a solution containing 25 mmol/L of a concentration of zinc iodide and 0.01% by volume of a concentration of thioglycolic acid in methanol was used as the ligand solution that was used in step PC2 in Example 1.

Example 13

A photodetector element was prepared in the same manner as in Example 1 except that a methanol solution of tetrabutylammonium iodide (concentration: 0.01% by volume) was used as the ligand solution that was used in step PC2 in Example 1.

The in-plane uniformity of the photodetector elements of Example 12 and Example 13 was measured by the above method. The evaluation results are shown in the table below.

TABLE 3

|  | Kind of ligand of photoelectric conversion layer | Kind of ligand of hole transport layer | In-plane uniformity (ΔEQE [%]) |
|---|---|---|---|
| Example 12 | Thioglycolic acid + zinc iodide | Thioglycolic acid | 2.5 |
| Example 13 | tetrabutylammonium iodide | Thioglycolic acid | 2.1 |

In the photodetector elements of Examples 12 and 13, the in-plane uniformity was also remarkably excellent as compared with Comparative Example 1. In addition, the photodetector elements of Example 12 and Example 13 had the same external quantum efficiency as the photodetector element of Example 1.

In a case where an image sensor is prepared by a known method by using the photodetector element obtained in Example described and incorporating it into a solid-state imaging element together with an optical filter prepared according to the methods disclosed in WO2016/186050A and WO2016/190162A, it is possible to obtain an image sensor having good visible and infrared imaging performance.

In each embodiment, the same effect can be obtained even in a case where the semiconductor quantum dots of the photoelectric conversion layer and the hole transport layer are changed to PbSe quantum dots.

EXPLANATION OF REFERENCES 1, 2: photodetector element
11: upper electrode
12: lower electrode
13: photoelectric conversion layer
14: hole transport layer

What is claimed is:

1. An image sensor, comprising a photodiode-type photodetector element, wherein the photodiode-type photodetector element comprising:
a lower electrode;
an upper electrode opposite to the lower electrode;
a photoelectric conversion layer provided between the lower electrode and the upper electrode, wherein the photoelectric conversion layer containing aggregates of semiconductor quantum dots QD1 that contain a metal atom and containing a ligand L1 that is coordinated to the semiconductor quantum dot QD1, wherein the ligand L1 contains a ligand containing a halogen atom and a polydentate ligand containing two or more coordination moieties; and
a hole transport layer provided between the lower electrode and the photoelectric conversion layer, wherein the hole transport layer containing aggregates of semiconductor quantum dots QD2 that contains a metal atom and containing a ligand L2 that is coordinated to the semiconductor quantum dot QD2, the hole transport layer being arranged on the photoelectric conversion layer, wherein the ligand L2 includes a ligand different from the ligand L1,
wherein the semiconductor quantum dot QD1 and the semiconductor quantum dot QD2 each contain the same kind of semiconductor quantum dot,
wherein the ligand L2 includes a ligand represented by any one of Formulae (A) to (C), $$X^{A1}-L^{A1}-X^{A2} \quad (A)$$

$$X^{B1}-L^{B1}-X^{B3}-L^{B2}-X^{B2} \quad (B)$$

$$X^{C1}-L^{C1}-\underset{\underset{L^{C3}-X^{C3}}{|}}{X^{C4}}-L^{C2}-X^{C2} \quad (C)$$

in Formula (A), $X^{A1}$ and $X^{A2}$ each independently represent a thiol group, an amino group, a hydroxy group, a carboxy group, a sulfo group, a phospho group, or a phosphonic acid group, and
$L^{A1}$ represents a hydrocarbon group, where $X^{A1}$ is a group different from $X^{A2}$;
in Formula (B), $X^{B1}$ and $X^{B2}$ each independently represent a thiol group, an amino group, a hydroxy group, a carboxy group, a sulfo group, a phospho group, or a phosphonic acid group,
$X^{B3}$ represents S, O, or NH, and
$L^{B1}$ and $L^{B2}$ each independently represent a hydrocarbon group;
in Formula (C), $X^{C1}$ to $X^{C3}$ each independently represent a thiol group, an amino group, a hydroxy group, a carboxy group, a sulfo group, a phospho group, or a phosphonic acid group,
$X^{C4}$ represents N, and
$L^{C1}$ to $L^{C3}$ each independently represent a hydrocarbon group.

2. The image sensor according to claim 1, wherein one of $X^{A1}$ or $X^{A2}$ in Formula (A) is a thiol group, at least one of $X^{B1}$ or $X^{B2}$ in Formula (B) is a thiol group, and at least one of $X^{C1}$ to $X^{C3}$ in Formula (C) is a thiol group.

3. The image sensor according to claim 1, wherein the ligand L2 is at least one selected from thioglycolic acid, 3-mercaptopropionic acid, 2-aminoethanethiol, or 2-mercaptoethanol.

4. The image sensor according to claim 1, wherein the ligand containing a halogen atom is an inorganic halide.

5. The image sensor according to claim 4, wherein the inorganic halide contains a Zn atom.

6. The image sensor according to claim 1, wherein the ligand containing a halogen atom contains an iodine atom.

7. The image sensor according to claim 1, wherein the semiconductor quantum dot QD1 and the semiconductor quantum dot QD2 each contain a Pb atom.

8. The image sensor according to claim 1, wherein the semiconductor quantum dot QD1 and the semiconductor quantum dot QD2 each contain PbS.

9. The image sensor according to claim 1, wherein an energy difference $\Delta^{E1}$ between a Fermi level of the photoelectric conversion layer and a conductor lower end and an energy difference $\Delta^{E2}$ between a Fermi level of the hole transport layer and the conductor lower end satisfy a relationship of Expression (1), $$(\Delta^{E2}-\Delta^{E1}) \geq 0.1[eV] \tag{1}$$

10. The image sensor according to claim 1, wherein the image sensor is an infrared image sensor.

11. The image sensor according to claim 1, wherein the ligand L2 is thioglycolic acid or 2-aminoethanethiol.

* * * * *